(12) United States Patent
Ushiyama

(10) Patent No.: US 6,960,793 B2
(45) Date of Patent: Nov. 1, 2005

(54) SEMICONDUCTOR INTEGRATED CIRCUIT

(75) Inventor: Kenichi Ushiyama, Tachikawa (JP)

(73) Assignee: Fujitsu Limited, Kanagawa (JP)

( * ) Notice: Subject to any disclaimer, the term of this patent is extended or adjusted under 35 U.S.C. 154(b) by 0 days.

(21) Appl. No.: 10/795,376

(22) Filed: Mar. 9, 2004

(65) Prior Publication Data

US 2004/0206985 A1 Oct. 21, 2004

(30) Foreign Application Priority Data

Mar. 10, 2003 (JP) ........................................ 2003-063843

(51) Int. Cl.⁷ ............................................. H01L 27/10
(52) U.S. Cl. ...................................... 257/207; 257/691
(58) Field of Search ................................ 257/207, 691

(56) References Cited

U.S. PATENT DOCUMENTS 5,229,639 A * 7/1993 Hansen et al. .............. 257/666

* cited by examiner

*Primary Examiner*—Thien F. Tran
(74) *Attorney, Agent, or Firm*—Swidler Berlin LLP

(57) ABSTRACT

A semiconductor integrated circuit is described. The circuit has a power circuit structure that efficiently reduces the power drop in areas of the chip of the power circuit. The semiconductor integrated circuit includes the first mesh-style power circuit that supplies a fixed amount of power to a first area and a second mesh-style power circuit that supplies a substantially similar amount of power to a second area. It is desired that the first mesh-style power circuit and the second mesh-style power circuit are separated at a dividing line between the first and second areas.

9 Claims, 12 Drawing Sheets

SEMICONDUCTOR INTEGRATED CIRCUIT

CROSS-REFERENCE TO RELATED APPLICATIONS

This application is based upon and claims the benefit of priority from the prior Japanese Patent Application No. 2003-63843, filed on Mar. 10, 2003, the entire contents of which are incorporated herein by reference.

FIELD OF THE INVENTION

The present invention relates to a semiconductor integrated circuit structure. More specifically, the present invention relates to the structure of a power supply wiring in a semiconductor integrated circuit.

BACKGROUND OF THE INVENTION

The power supply wiring of a semiconductor integrated circuit generally includes a mesh-style wiring structure. The I/O cell of the semiconductor integrated circuit is located on the periphery of the chip. The power coming from the exterior pad, through the I/O cell, is supplied to the interior mesh-style power supply wiring network. At each interior point in the semiconductor integrated circuit, the interior cell receives and consumes the power coming from the power supply wiring network. Because power is consumed at each interior point in the semiconductor integrated circuit, the voltage of the power supply wiring network diminishes as it nears the center of the chip. In other words, the voltage of the power supply wiring network is higher on the periphery of the semiconductor integrated circuit and becomes lower as it nears the center. This may be undesirable in many applications.

To avoid this, many current methods control the power supply wiring network voltage drop by widening the power supply wirings and increasing the number of the I/O cells that supply power from the exterior source. Other methods employ a power circuit, installed at a right angle to the mesh-style power circuit, to avoid the imbalance of voltage supply caused by spatially uneven consumption of power.

SUMMARY OF THE INVENTION

In one embodiment, the present invention comprises a first mesh-style power supply wiring that provides a given amount of power to a first area and a second mesh-style power supply wiring that provides said given amount of power to a second area (separate from the first area). The first mesh-style power supply wiring and the second mesh-style power supply wiring are preferably separated at the dividing line between the first area and the second area.

One embodiment of the semiconductor integrated circuit according to the present invention includes a basic trunk power supply wiring, a first power supply wiring that is connected with the basic trunk power supply wiring and supplies power to a first area located within a first distance from said basic truck power supply wiring. Also included are a second power supply wiring that supplies the power to a second area located at a distance which is greater than the first distance from said basic trunk power supply wiring. A power supply route that supplies the power to the second power supply wiring without passing through the first power supply wiring is also included.

In the aforementioned semiconductor integrated circuit, it is possible to reduce the area of the power supply from one power supply network to a cell by dividing the power supply wiring. This way it is possible to control the amount of the power consumption per power network and reduce the power drop in the area further away from the basic trunk power supply wiring. In other words, by supplying power independently to the mesh-style power supply wiring whose area of the power supply is limited to the center area, the power drop around the center of the chip may be controlled.

DETAILED DESCRIPTION OF THE PREFERRED EMBODIMENTS

When power drops near the center of a chip, the cells located around the center cannot function in their normal conditions. It is difficult to efficiently prevent the power drop by widening the circuits and increasing the number of I/O cells as described above. Further, there is a limit as to the extent the power circuit can be widened and the number of the power I/O cells is increased in order to accomplish the ideal integration density and the ideal chip size.

Therefore, the present invention provides a semiconductor integrated circuit that has a power circuit structure that can efficiently reduce the power drop in the areas within the chip of the power circuit.

Figure 1:
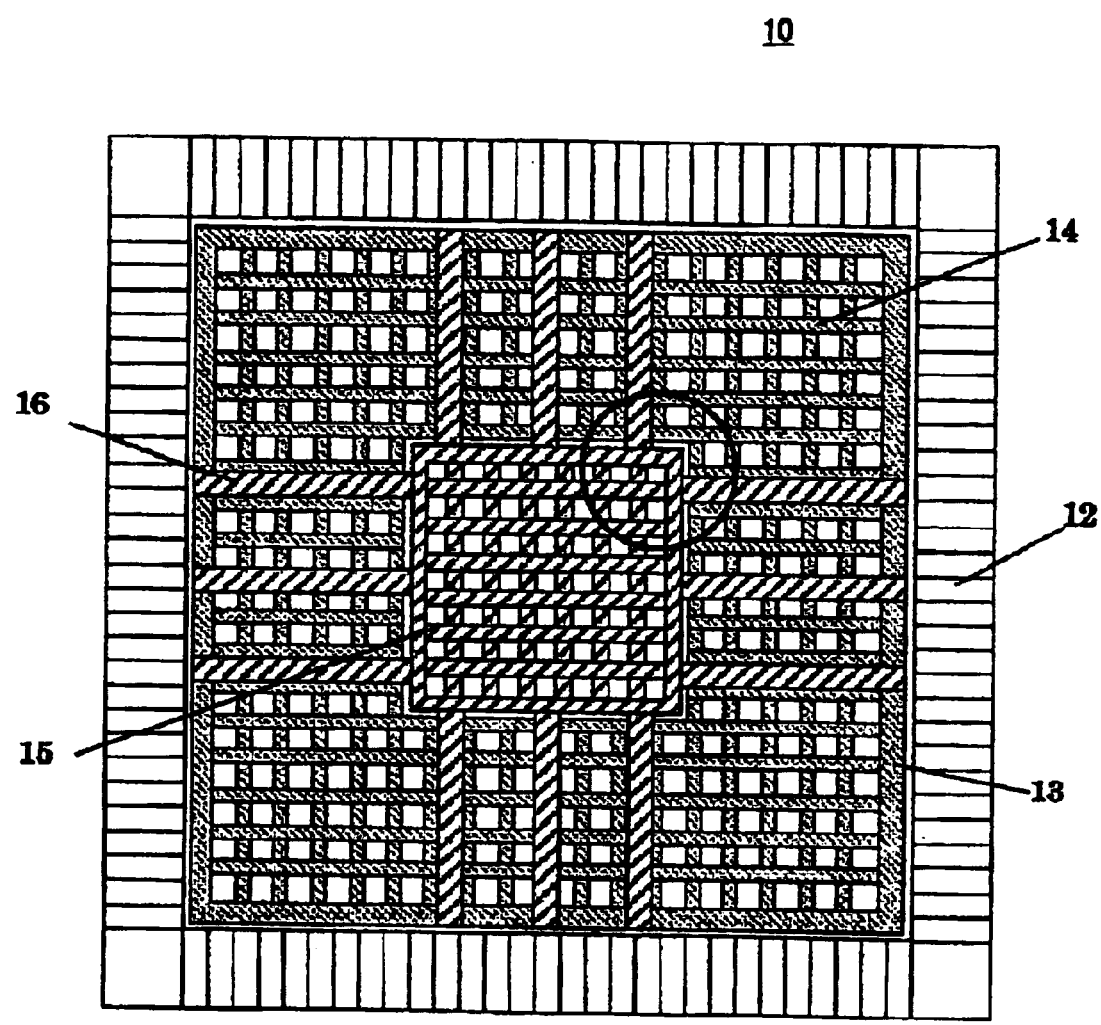
FIG. 1 is a diagram showing a first embodiment of the power supply wiring structure of the semiconductor integrated circuit according to the present invention.

FIG. 1 describes a first embodiment of the power supply wiring structure of the semiconductor integrated circuit of the present invention. In the first embodiment, the semiconductor integrated circuit 10, includes multiple I/O cells 12, a chip ring 13, a first mesh-style power supply wiring 14, a second mesh-style power supply wiring 15, and a direct power supply wiring 16. The multiple I/O cells 12 are generally located around the periphery of the chip. Each I/O cell 12 includes circuits similar to a buffer and provides a signal conversion function between the outside and inside of the chip. Among the I/O cells 12, the power I/O cell relating to the power supply is a section made of aluminum wire located between the chip ring 13 and the pad, in which a circuit is included for the prevention of an electrostatic breakdown.

A chip ring 13 is the basic trunk power supply wiring installed in the ring form on the outer periphery of the chip, through which the power is supplied to the power supply wiring inside of the chip. In one embodiment, the power supply wiring inside of the semiconductor integrated circuit is divided into multiple segments. In the FIG. 1 embodiment, it is divided into a mesh-style power supply wiring 14 installed near the periphery of the chip and a mesh-style power supply wiring 15 which is installed around the center of the interior side of the chip. The mesh-style power supply wiring 14 is connected with each cell of the corresponding parts of the chip (located near the periphery of the chip) and supplies power to those cells. The mesh-style power supply wiring 15 is connected with the corresponding cells of the chip (located around the center of the chip) and supplies power to these cells.

The chip ring 13 supplies power directly to the mesh-style power supply wiring 14 and also supplies power to the mesh-style power supply wiring 15 through the direct power supply wiring 16. The direct power supply wiring 16 which supplies power directly to the mesh-style power supply wiring, is not directly connected with any cell within the semiconductor integrated circuit 10. The direct power supply wiring 16 supplies power to each cell only through the mesh-style power supply wiring 15. In addition, the mesh-style power supply wiring 14 and the mesh-style power supply wiring 15 are not connected with each other at the boundary between the two.

Figure 2:
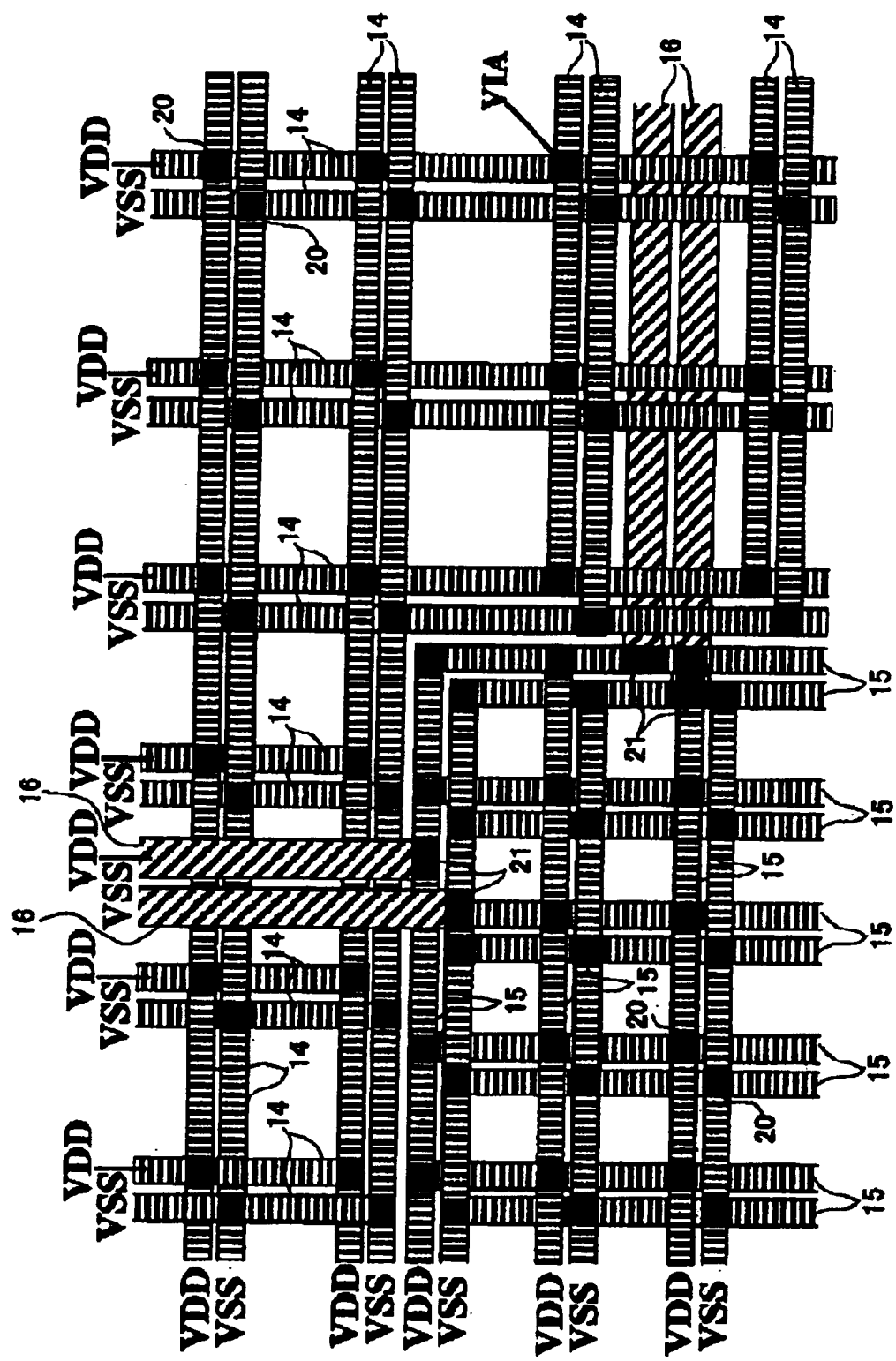
FIG. 2 is a diagram showing a more detailed view of the area circled FIG. 1.

FIG. 2 is a diagram showing a more detailed view of the power supply wiring in the area circled in FIG. 1. As shown in FIG. 2, the mesh-style power supply wiring 14 and the-mesh style power supply wiring 15 include a voltage supply line VDD and a ground voltage line VSS respectively. The power supply wiring that expands horizontally and the power supply wiring that expands vertically are located at different layers of the circuit, and are connected by the contact 20. Similarly, the direct power supply wiring 16 comprises the voltage supply line VDD and the ground voltage line VSS, and is located at a different layer from the horizontal and vertical supply wirings of the mesh-style supply wiring 14.

The mesh-style power supply wiring 15 is preferably connected with the direct power supply wiring 16 through a contact 21 and is supplied with power by the chip ring 13, as shown in FIG. 1. The mesh-style power supply wiring 15 and the mesh-style power supply wiring 14 are not connected at the bordering location. However, both are connected with the chip ring 13, and thus they are basically connected through the chip ring 13.

In one embodiment, it is possible to reduce the area of the power supply from one power supply network to a cell by dividing the power supply wiring. This way it is possible to control the amount of power consumption per power supply network, and reduce the power drop in the area further away from the basic trunk power supply wiring. In other words, in the embodiment shown in FIG. 1, it is possible to control the power drop in the center of the chip by supplying power, through the direct power supply wiring 16, from the chip ring 13 to the mesh-style power supply wiring 15 whose area of the power supply is limited to the center.

As shown FIG. 1, the chip ring 13, which is the main source of the power supply, is located on the periphery and the power supply wiring is divided into two parts between the center area and the peripheral area. However, in other embodiments the dividing line can be drawn between the left and right portions of the chip rather than between the center and periphery. It may be efficient to divide the power supply wiring between the left half portion and the right half portion of the chip when the basic trunk power supply wiring, which is the main source of the power supply, is located on the left hand side (or right hand side) of the chip. As described above, in other embodiments it is possible to divide the power supply wiring using any desired method. The present invention is not intended to be limited to any particular method. In some embodiments it may be desirable to divide the power supply wiring into three or more parts.

Figure 3:
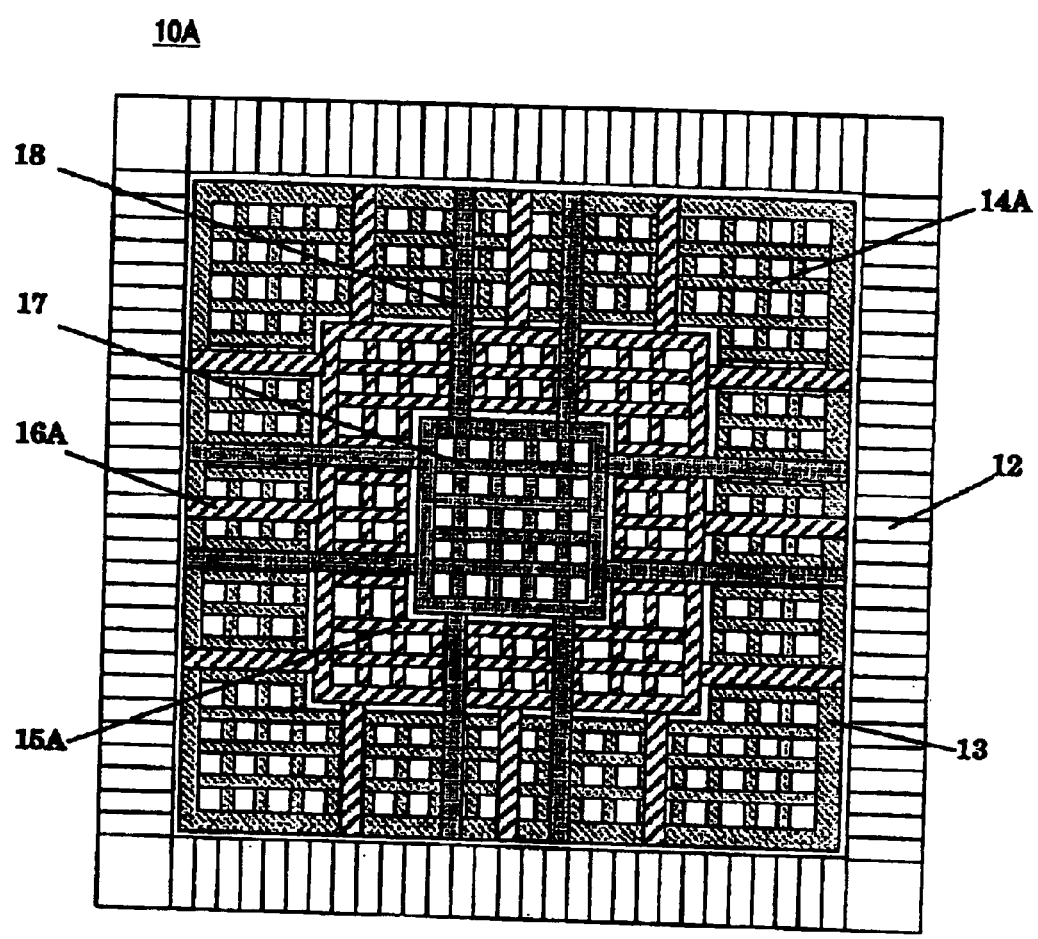
FIG. 3 is a diagram showing an exemplary structure of the power supply wiring.

FIG. 3 is a diagram showing an exemplary power supply wiring that is divided into three parts: a center, interior and periphery. In FIG. 3, the same numbers refer to the same parts described with reference to FIG. 1. In one embodiment, the mesh-style power supply wiring 14A is the power supply network which is the closest to the periphery, and the mesh-style power supply wiring 15A is the power supply network which is the next closest to the periphery. In one embodiment the mesh-style power supply wiring 17 is the power supply network located around the center. Power is supplied directly from the chip ring 13 to the mesh-style power supply wiring 14A. Power is supplied to the mesh-style power supply wiring 15A from the chip ring 13 through the direct power supply wiring 16A. Additionally, power is supplied to the mesh-style power supply wiring 17 from the chip ring 13 through the direct power supply wiring 18.

In one embodiment the direct power supply wiring 16A is not directly connected with each cell within the semiconductor integrated circuit 10, and supplies power to each cell only through the mesh-style power supply wiring 15A. In addition, the direct power supply wiring 18 is not directly connected with each cell within the semiconductor integrated circuit 10, and supplies power to each cell only through the mesh-style power supply wiring 17. The mesh-style power supply wiring 14A, the mesh-style power supply wiring 15A and the mesh-style power supply wiring 17 are preferably not connected to each other at each bordering point.

Figure 4:
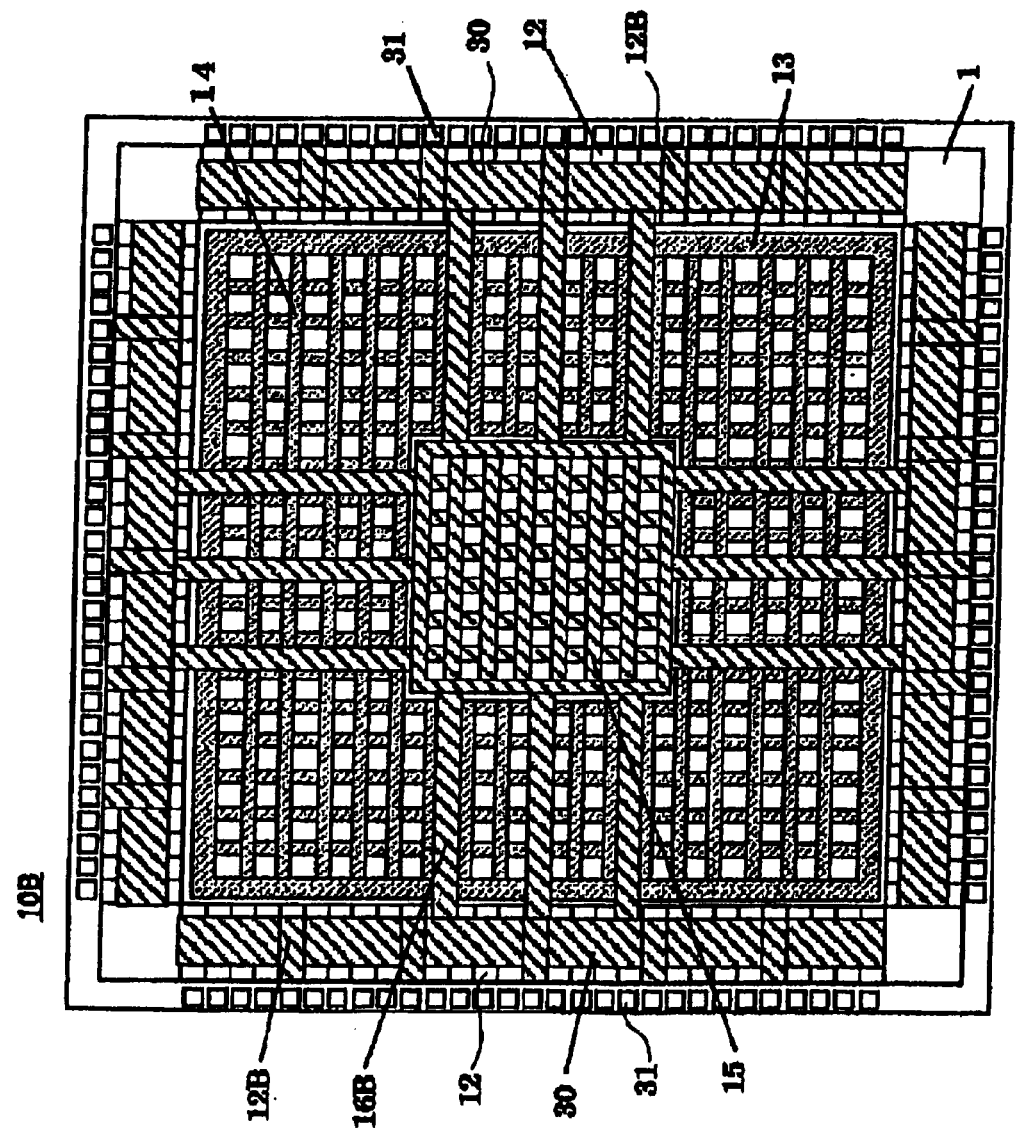
FIG. 4 is a diagram showing a modified example of the first embodiment of the power supply wiring structure of the semiconductor integrated circuit.

FIG. 4 is a diagram showing a modified example of the first embodiment of the power supply wiring structure with respect to the semiconductor integrated circuit according to the present invention. In FIG. 4, the numbers refer to the same descriptions as described with respect to FIG. 1. In the FIG. 4 embodiment power is supplied to the mesh-style power supply wiring 15 directly from the power supply pad 31 rather than from the chip ring 13. In other words, power is supplied to the chip ring 13 from the power supply pad 31 through the I/O cell 12, while power is supplied to the mesh-style power supply wiring 15 without passing through the I/O cell 12 and the chip ring 13. Specifically, the power supply pattern 12B and the power supply pattern 30 are made to connect with each other on the I/O cell 12. The power supply pattern 12B is connected to the power supply pad 31, and supplies power to the mesh-style power supply wiring from the power supply pattern 30 through the direct power supply wiring 16B. This structure, in which power is supplied to the mesh-style power supply wiring 14 from the power supply pad 31 through the I/O cell 12, and to the mesh-style power supply wiring 15 from the power supply pad 31 through the power supply pattern 12B, enables both power supply routes to be completely separate. As a result, in the case of the example shown in FIG. 4, the effect of the power supply separation is larger compared to the embodiment shown in FIG. 1.

Figure 5:
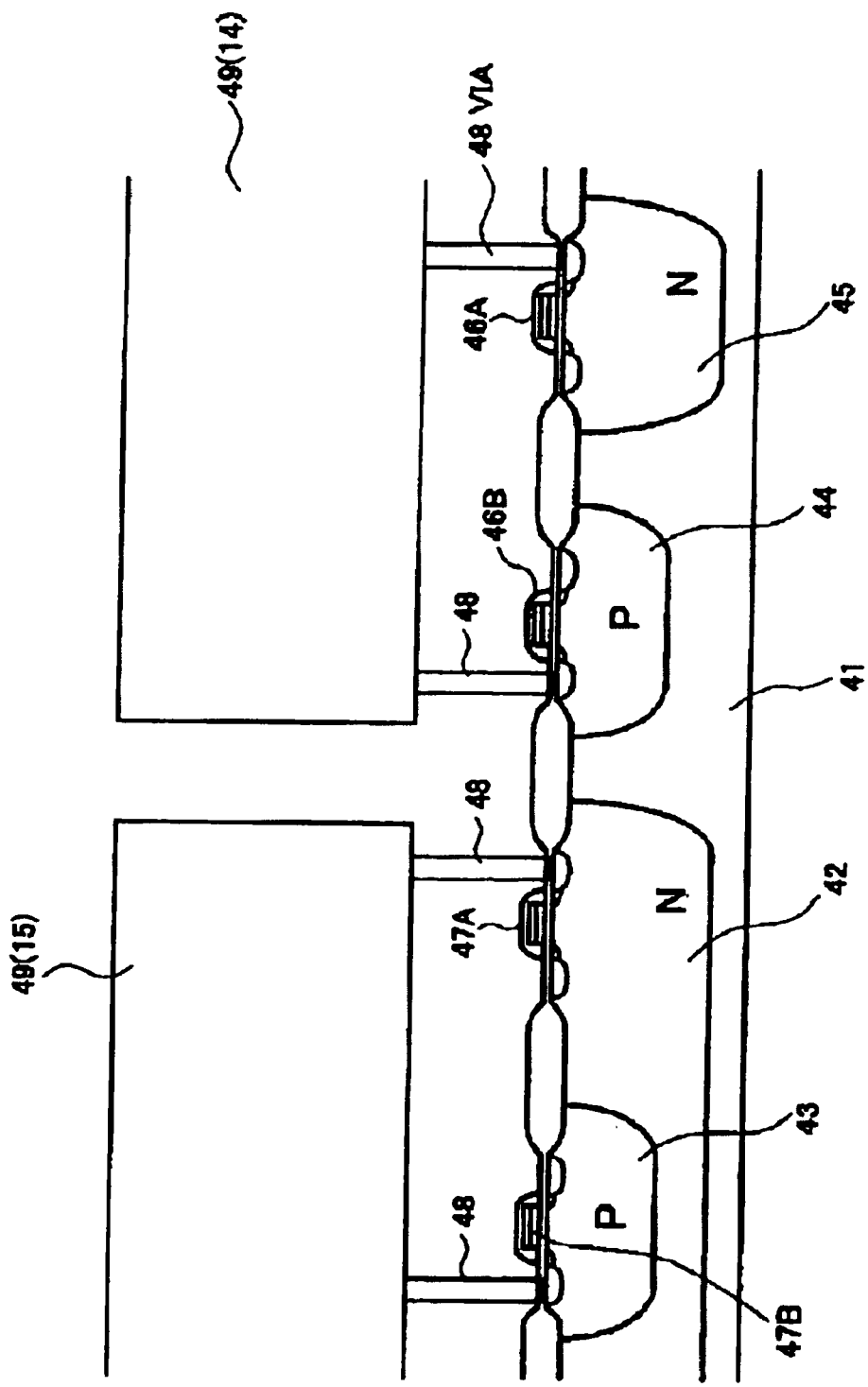
FIG. 5 is a diagram showing an exemplary structure of the semiconductor integrated circuit according to the present invention.

FIG. 5 is a diagram showing an exemplary structure of the semiconductor integrated circuit according to the present invention. In this embodiment, the semiconductor substrate in addition to the power supply wiring preferably delivers power. As a result, the effect of the power supply separation becomes larger by making the semiconductor substrate a three-well structure and separating the structure of the substrate between the mesh-style power supply wiring 14 and the mesh-style power supply wiring 15. In FIG. 5, the N-type well 45 and the P-type well 44 are formed in the P-type substrate 41, and the PMOS transistor 46A and the NMOS transistor 46B are formed for each well. In addition, the N-type well 42 is formed on the P-type substrate 41 and the P-type well 43 is formed within the N-type well 42. The PMOS transistor 47A and the NMOS transistor 47B are formed for these wells.

In one embodiment, the PMOS transistor 46A and the NMOS transistor 46B receive power from the power supply wiring 49 of the mesh-style power supply wiring 14 by passing through the contacts 48. The PMOS transistor 47A and the NMOS transistor 47B receive power from the power supply wiring 49 of the mesh-style power supply wiring 15 by passing through the contacts 48. As shown in FIG. 1, the mesh-style power supply wiring 14 and the mesh-style power supply wiring 15 are power supply networks separated from each other.

In the FIG. 5 embodiment, transistors 46A and 46B of the cell on the side of the mesh-style power supply wiring 14 and the transistors 47A and 47B of the cell on the side of the mesh-style power supply wiring 15 are separated by the 3-well structure. Since the current path through a parasitic resistance between the area in which transistors 46A and 46B are formed and the area in which 47A and 47B are formed is cut off by the 3-well structure, the power from the mesh-style power supply wiring 14 is consumed only in the area in which transistors 46A and 46B are formed and the power from the mesh-style power supply wiring 15 is consumed only in the area in which transistors 47A and 47B are formed. Therefore, currents flowing through the substrate are separated and the effect of the power supply separation becomes larger.

Figure 6:
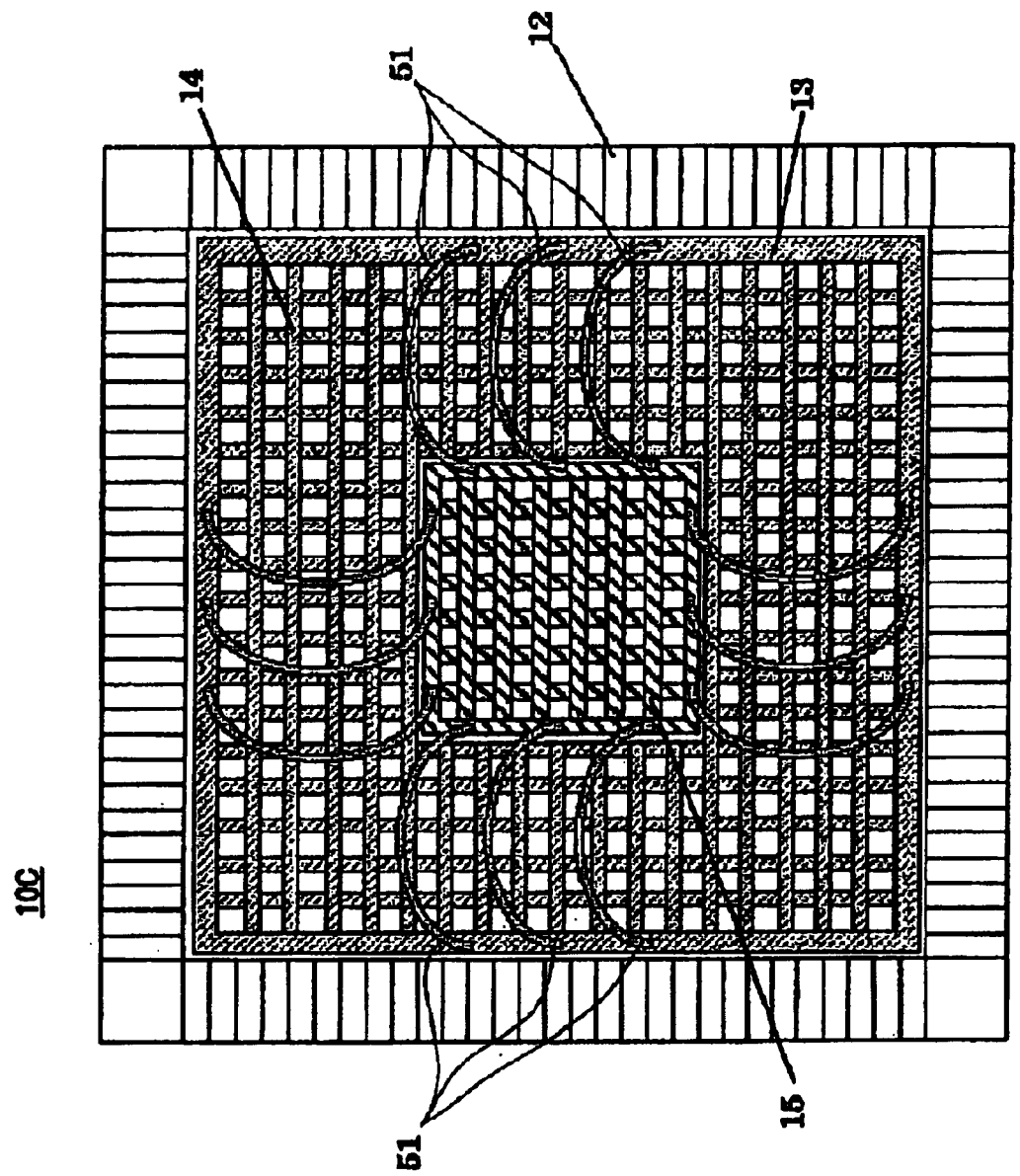
FIG. 6 is a diagram showing a second embodiment of the power supply wiring structure of the semiconductor integrated circuit.

FIG. 6 is a diagram showing a second embodiment of the power supply wiring structure of the semiconductor integrated circuit according to the present invention. The same numbers in FIG. 6 refer to the same descriptions made with reference to FIG. 1. In the first embodiment described in FIG. 1, power to the mesh-style power supply wiring 15, which is separated inside of the chip, is supplied from the chip ring 13 through the direct power supply wiring 16. In the second exemplary embodiment shown in FIG. 6, power to the mesh-style power supply wiring 15, which is separated inside of the chip, is supplied from the chip ring 13 through the wire bonding 51. The width and the number of the wires for power supply is preferably sufficient to provide the amount of currents consumed at the location of the mesh-style power supply wiring 15. In the FIG. 6 embodiment, power to the mesh-style power supply wiring, which is separated inside of the chip, is supplied through the wire bonding and thus the number of the wiring layer may be reduced compared with that of the first embodiment.

Figure 7:
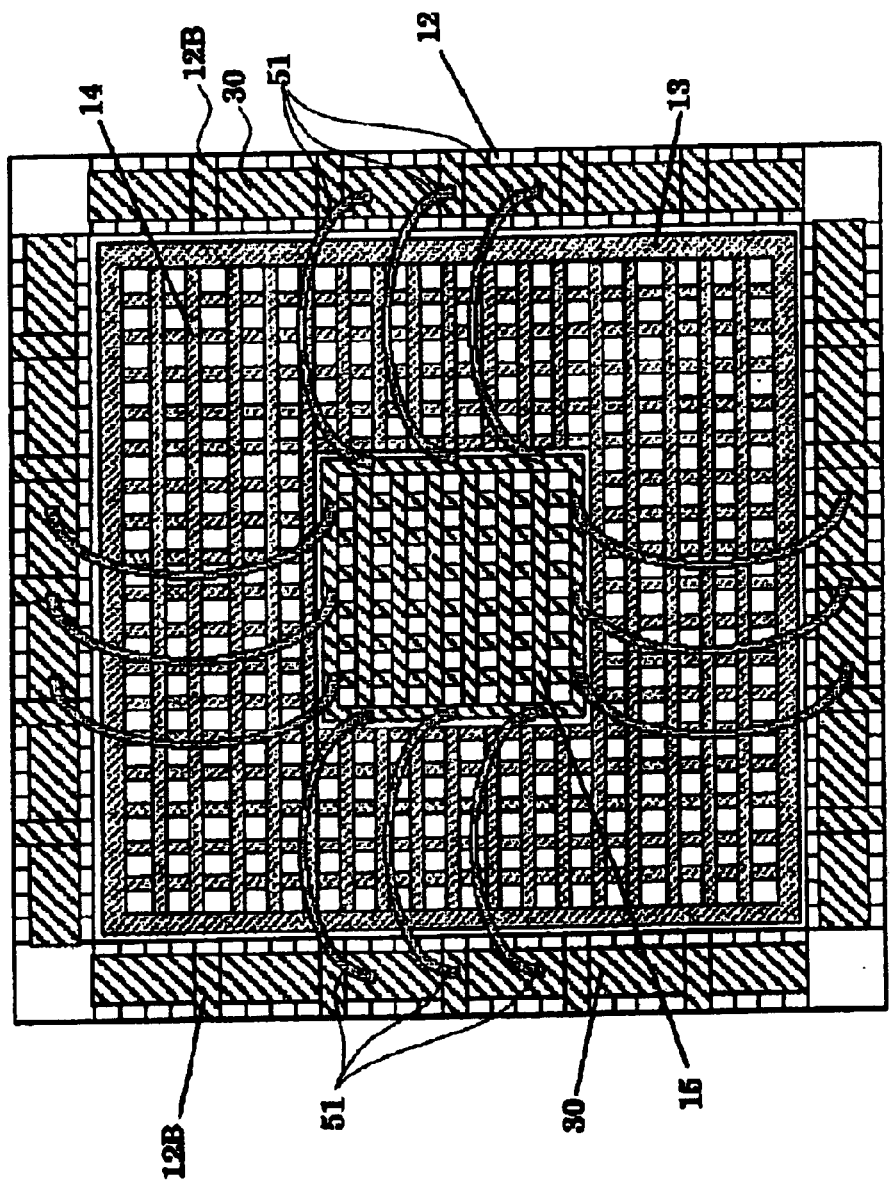
FIG. 7 is a diagram showing a modified example of the second embodiment of the power supply wiring structure of the semiconductor integrated circuit according to the present invention.

FIG. 7 is a diagram showing a modified example of the second embodiment of the power supply wiring structure of the semiconductor integrated circuit in this invention. In FIG. 7, the same numbers refer to same descriptions made with reference to FIGS. 4 and 6. In the FIG. 7 embodiment, power to the mesh-style power supply wiring 15, which is separated inside of the chip, is supplied from the power supply pattern 12B and power supply pattern 30 that are formed on the I/O cell 12 through the wire bonding 51. The power supply to the mesh-style power supply wiring 14 is substantially similar to the example in FIG. 4.

This structure, in which power is supplied to the mesh-style power supply wiring 14 from the power supply pad through the I/O cell 12 and to the mesh-style power supply wiring 15 from the power supply pad through the power pattern 12B, enables both power supply routes to be substantially separate. As a result, the effect of the power supply separation is larger than the power supply separation described with reference to FIG. 6.

Figure 8:
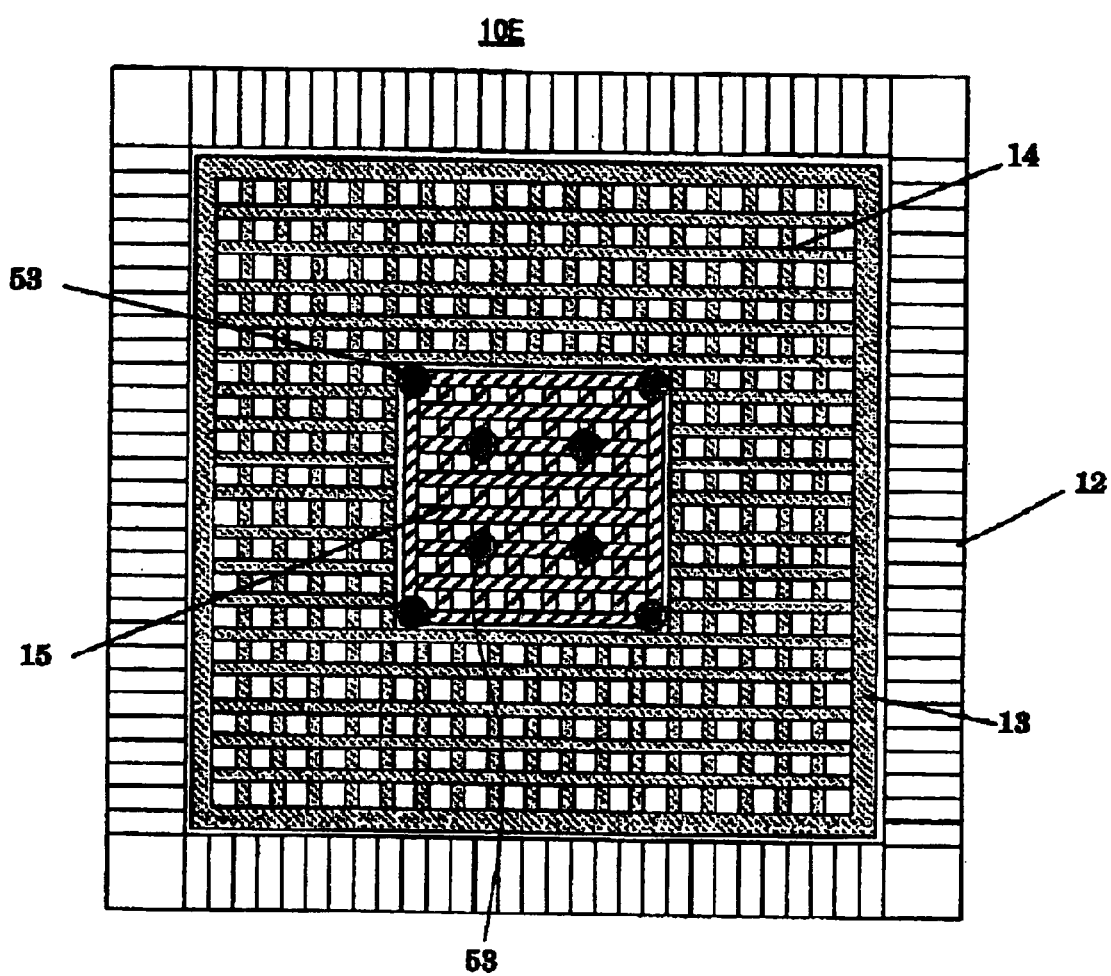
FIG. 8 is a diagram showing a third embodiment of the power supply wiring structure of the semiconductor integrated circuit according to the present invention.

FIG. 8 is a diagram showing a third embodiment of the power supply wiring structure of the semiconductor integrated circuit according to the present invention. In FIG. 8, the same numbers refer to the same descriptions made with respect to FIG. 1. In the FIG. 1 embodiment, power to the mesh-style power supply wiring 15, which is separated inside of the chip, is supplied from the chip ring 13 by passing through the direct power supply 16. On the other hand, in the FIG. 8 embodiment, power to the mesh-style power supply wiring 15, which is separated inside of the chip, is supplied through the bump 53. Enough bumps are formed for purposes of supplying currents to be consumed at the location of the mesh-style power supply wiring 15.

Figure 9:
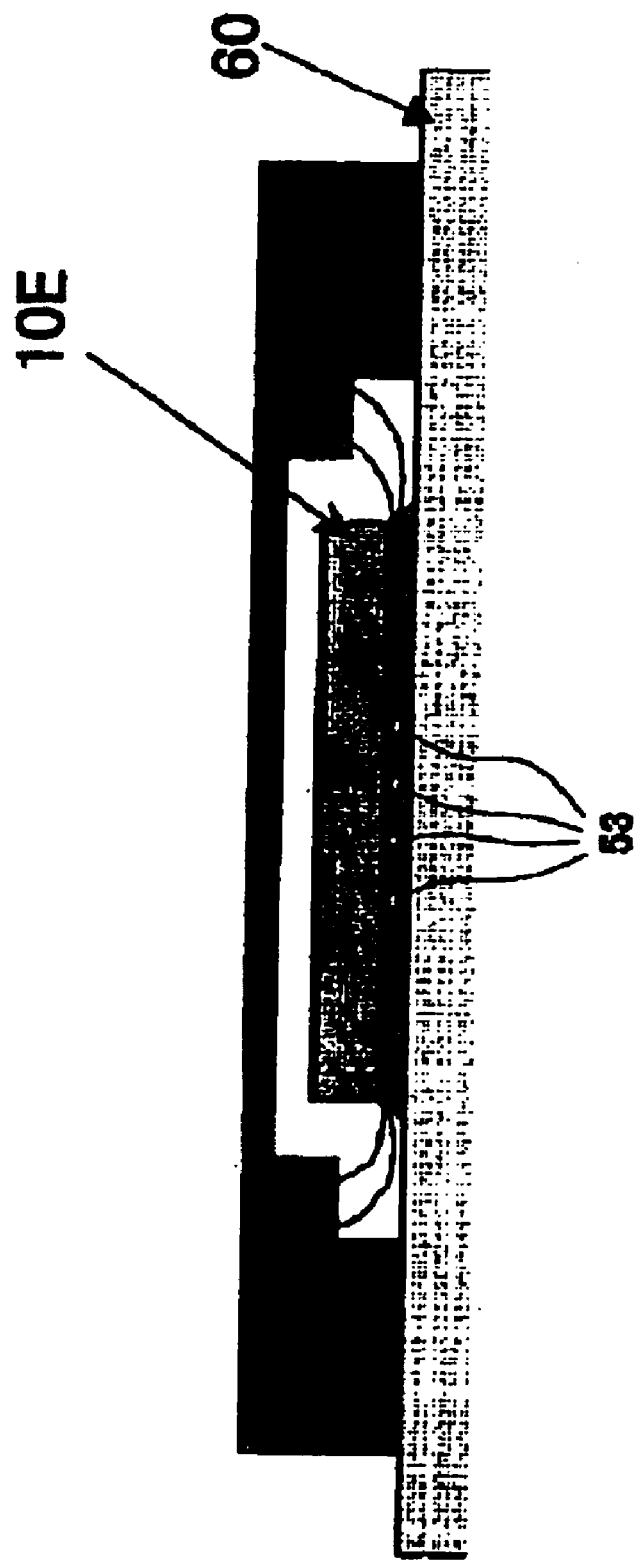
FIG. 9 shows a diagram in which the semiconductor shown in FIG. 8 is mounted.

FIG. 9 is a diagram in which the semiconductor chip 10E is mounted. As shown in FIG. 9, the semiconductor chip 10E, in which the bumps 53 are formed on the mesh-style power supply wiring 15, is preferably mounted on the package 60 so that the bump 53 is connected with the power supply wiring of the package 60. Therefore, in the case of the third embodiment, it becomes possible to supply power to the mesh-style power supply wiring 15 directly from the outside of the semiconductor chip 10E.

In this embodiment, the number of wiring layers can be reduced compared with that of the first embodiment because power to the mesh-style power supply wiring, which is separated inside the chip, is supplied through the bump. In addition, because it is possible to completely divide the power supply route between the mesh-style power supply wiring 14 and the mesh-style power supply wiring 15, the effect of the power supply separation is substantial.

Figure 10:
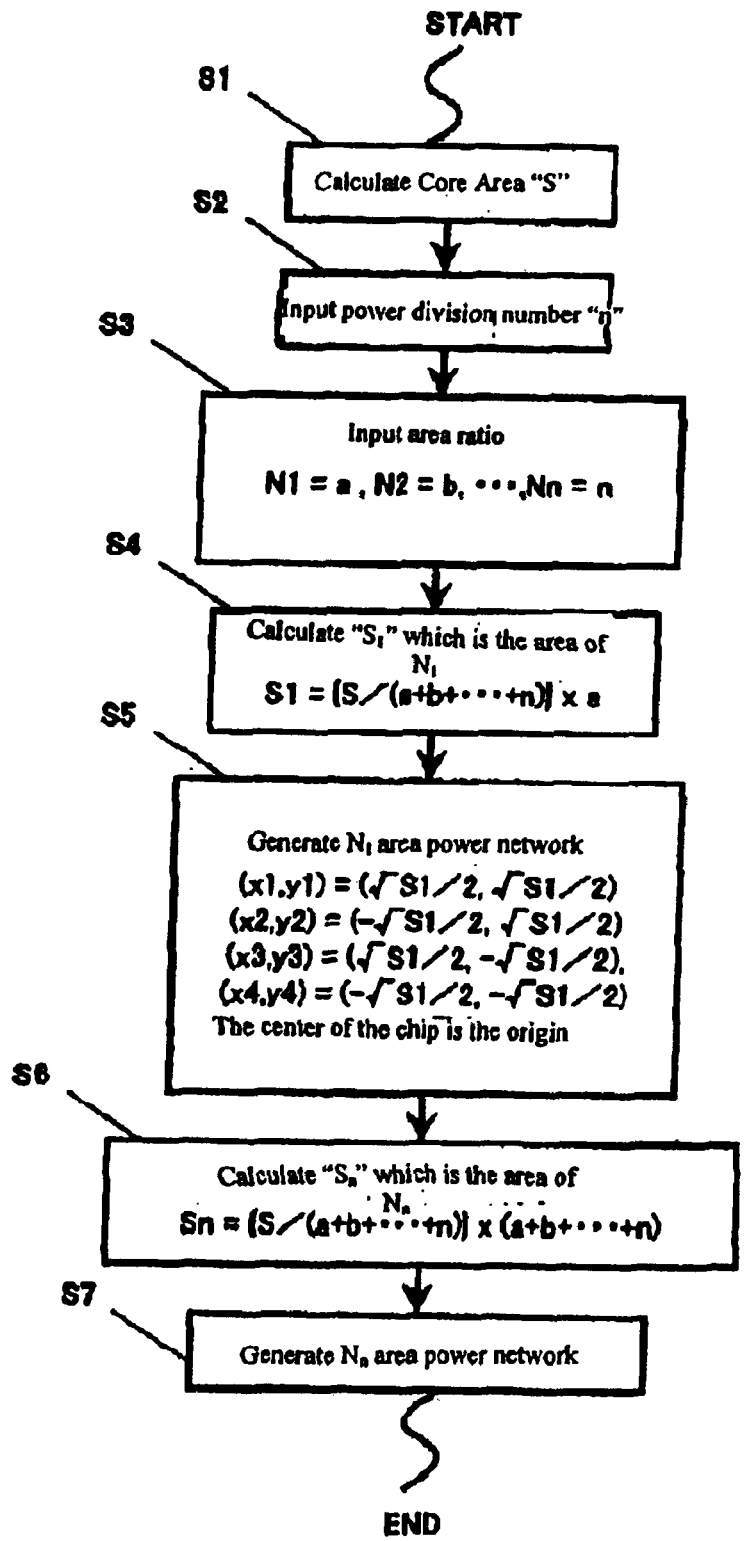
FIG. 10 is a flowchart showing an exemplary process of generating the power supply wiring layout according to the present invention.

FIG. 10 indicates a flow chart of an exemplary power supply wiring generation method in this invention. Step 1 in FIG. 10 calculates the size of the core area, which is the area in which a power supply network is generated. Step 2 identifies the number "n" by which the power supply wiring network is divided. Step 3 then identifies the ratio of the size of the power supply area for each of the power supply areas divided by "n". In other words, the size of the power supply areas is described as $N_1$ through $N_n$ while the ratio is described as a: b: ... :n. In step 4, the size $S_1$ of the first area $N_1$ is calculated. This is calculated based on the ratio of the first area $N_1$ against the entire area S. Step 5 generates a power supply network of the area $N_1$. In the case of the example in FIG. 10, the length of one side of a square with the area size $S_1$ is calculated by $\sqrt{S_1}$, and the power supply wiring is generated by identifying coordinates of the four summits of the square using the origin as the center point.

Step 6 calculates the size $S_n$ of the N-th area $N_n$. This is calculated based on the ratio of the N-th area $N_n$ against the entire area S. In the case of the example in FIG. 10, the first through N-th areas correspond to the most inside outline through the most outside outline, the area size is calculated so that each area includes the entire area inside of the corresponding outline. In Step 7, a power supply network of the area $N_n$ is generated. The power supply network is generated to each area by implementing the function of the aforementioned steps 6 and 7, for example, from inside area $N_1$ to $N_2$ through $N_n$ in order. In one embodiment, this completes the process. However, in other embodiments additional steps may be added or removed at any point within this exemplary process.

In the aforementioned description, a power supply network was generated by separating the core area by fixing the division number "n" and the area size ratio. However, the power supply network can be generated by separating the core area to achieve the ideal area size previously identified.

Figure 11:
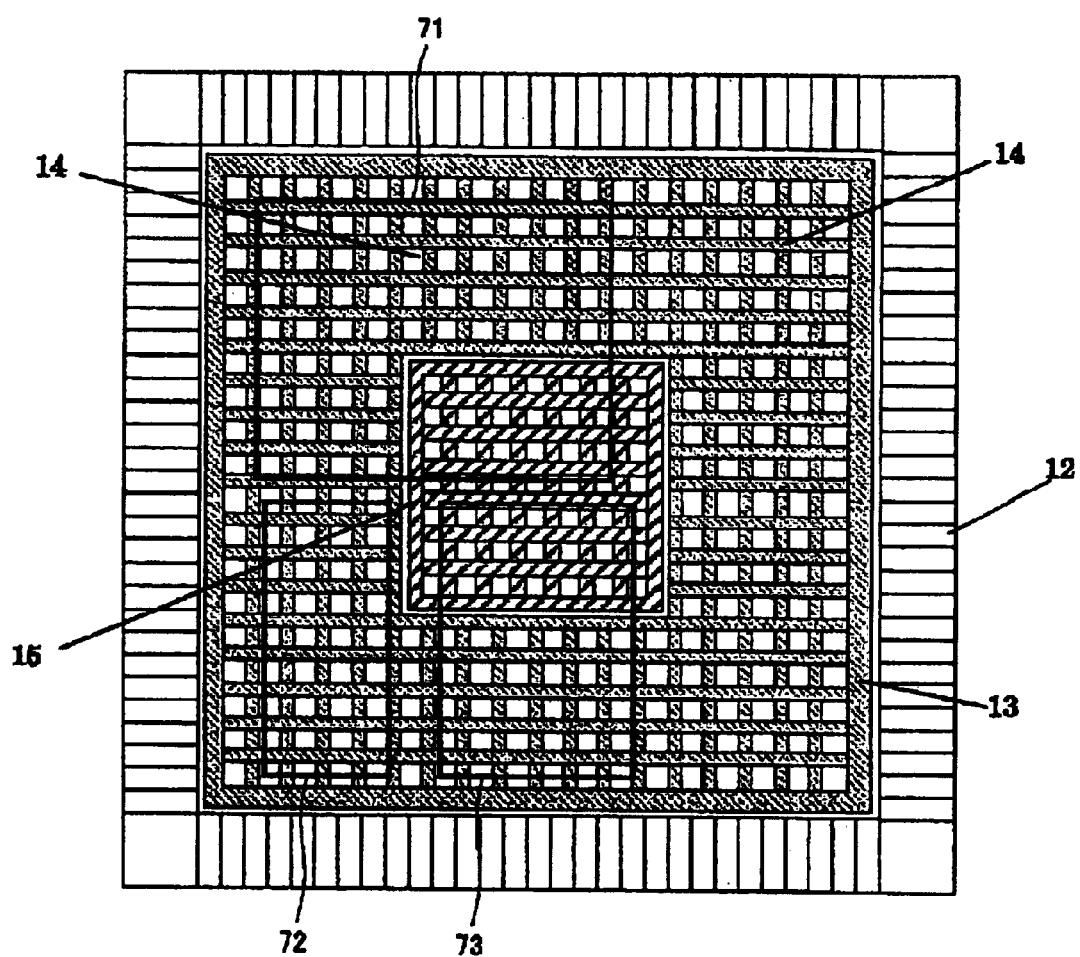
FIG. 11 is a diagram showing a process for a hierarchy layout.
Figure 12:
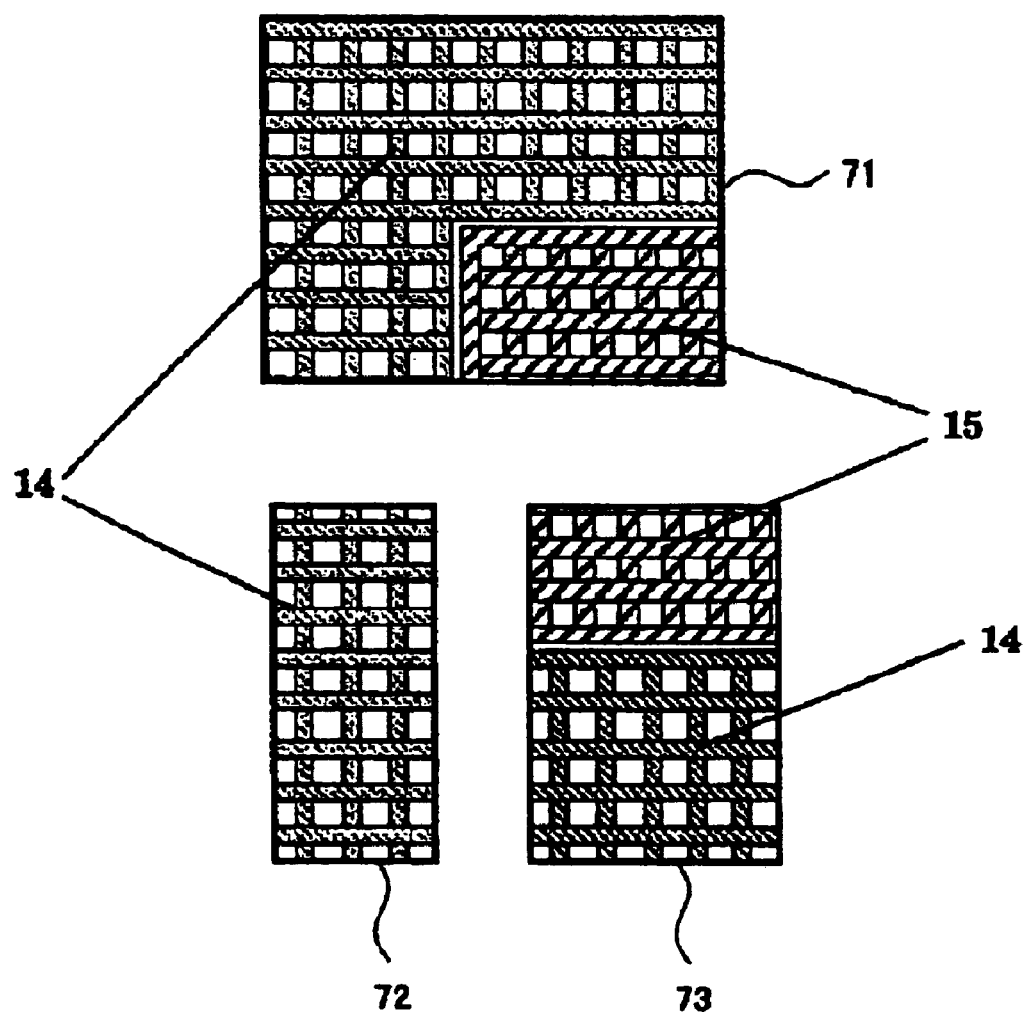
FIG. 12 is another diagram showing a process for a hierarchy layout.

FIG. 11 indicates a process for a hierarchical layout. In this embodiment of the hierarchical design method, Blocks 71 through 73, which are the layout areas divided by function and including cells and macros, are included inside the circuit. A designer different from the designer of the entire circuit (top level) designs Blocks 71 through 73 and the designer of the entire circuit treats these blocks as a black box in designing the circuit. In other words, the blocks are treated in the designing stage similarly as a macro. If the power supply network is divided in such a hierarchical layout according to the present invention, the power supply network comprised of the mesh-style power supply wiring 14 and the mesh-style power circuit 15 is first generated at the top level. Then, in designing the cell layout in connection with Blocks 71 through 73 at levels lower than the top level, as shown in FIG. 12, the mesh-style power supply wirings 14 and 15 that have been already generated are used inside of Blocks 71 through 73 respectively. Designing of the cell layout is accomplished in such a manner inside of Blocks 71 through 73 respectively.

It is preferable to design the cell layout in such a manner that cells and macros are not installed to overlap the bordering area of the divided power supply networks (in this example, the mesh-style power supply wiring 14 and the mesh-style power supply wiring 15). Because the degree of the power drop differs depending upon a divided power network, voltage for power supply is different between the divided power supply networks. If cells and macros are located to overlap the bordering area, one cell or macro receives voltage from different divided power networks and power supply voltage inside of the cell and macro can possibly differ significantly.

Although the present invention has been described with reference to particular embodiments, it will be understood to those skilled in the art that the invention is capable of a variety of alternative embodiments within the spirit of the appended claims.

What is claimed:

1. A semiconductor integrated circuit, comprising:
   a first mesh-style power supply wiring which supplies a given amount of power to a first area;
   a second mesh-style power supply wiring which supplies said given amount of power to a second area;
   wherein the first mesh-style power supply wiring and the second mesh-style power supply wiring are separated at a dividing line between the first and second area.

2. The semiconductor integrated circuit according to claim 1, further comprising an I/O cell, a first power supply pad and a second power supply pad, wherein said given amount of power is supplied to the first mesh-style power supply wiring from the first supply power pad through said I/O cell, and said given amount of power is supplied to the second mesh-style power supply wiring directly from the second power supply pad without passing through the I/O cell.

3. The semiconductor integrated circuit according claim 1, wherein a semiconductor substrate has a three-well structure which separates currents flowing through the substrate between said first and second areas.

4. The semiconductor or integrated circuit according to claim 1, wherein said first area is located on the periphery of the semiconductor integrated circuit and said second area is located towards the center of the semiconductor integrated circuit.

5. The semiconductor integrated circuit according to claim 4, further comprising a chip ring which supplies said given amount of power to the first mesh-style power supply wiring and a power supply wiring which supplies said given amount of power to the second mesh-style power supply wiring.

6. The semiconductor integrated circuit according to claim 4, further comprising a chip ring which supplies said given amount of power to the first mesh-style power supply wiring and a bump that is directly connected to an external power source, said bump being positioned substantially on the second mesh-style power supply wiring.

7. The semiconductor integrated circuit according to claim 4, further comprising a chip ring which supplies said given amount of power to the first mesh-style power supply wiring and a bonding wire that supplies said given amount of power to the second mesh-style power supply wiring.

8. The semiconductor integrated circuit according to claim 7, further comprising:
   a I/O cell;
   a first power supply pad; and
   a second power supply pad;
   wherein said given amount of power is supplied to said first mesh-style power supply wiring from said first power supply pad through said I/O cell and the chip ring and said bonding wire, connected with he second mesh-style power supply wiring, connects to the second power supply pad without passing through the I/O cell.

9. A semiconductor integrated circuit comprising:
   a basic trunk power supply wiring;
   a first power supply wiring which is connected to said basic trunk power supply wiring, and supplies power to a first area located within a first distance from said basic trunk power supply wiring;
   a second power supply wiring from said basic trunk power supply wiring which supplies the power to a second area located at a distance greater than said first distance; and
   a power supply route which supplies the power to the second power supply wiring without passing through the first power supply wiring;
   wherein said first area is selectively positioned on the periphery of said semiconductor integrated circuit, and said second area is selectively positioned towards the center of the semiconductor integrated circuit, wherein the basic trunk power supply wiring is a chip ring.

* * * * *